United States Patent [19]
Asato et al.

[11] Patent Number: 5,297,069
[45] Date of Patent: Mar. 22, 1994

[54] FINITE IMPULSE RESPONSE FILTER

[75] Inventors: Creigton S. Asato; Christoph Ditzen, both of San Jose, Calif.

[73] Assignee: VLSI Technology, Inc., San Jose, Calif.

[21] Appl. No.: 929,867

[22] Filed: Aug. 13, 1992

[51] Int. Cl.$^5$ .............................................. G06F 15/31
[52] U.S. Cl. .................................................. 364/724.16
[58] Field of Search ...................... 364/724.16, 724.01, 364/728.01, 757, 758

[56] References Cited
U.S. PATENT DOCUMENTS 4,080,660 3/1978 Constant ........................ 364/728.01
5,153,846 10/1992 Rao .................................. 364/724.16

*Primary Examiner*—Long T. Nguyen
*Attorney, Agent, or Firm*—Burns, Doane, Swecker & Mathis

[57] ABSTRACT

Output data points of a digital FIR filter are calculated by storing input data points in an addressable memory and accessing the addressable memory to supply a new input data point exactly once for each output data point after a first output data point and storing each input data point in a first recirculating memory for so long as that input data point is needed to calculate a next output data point. The input data points stored in the first recirculating memory are used to calculate output data points. Furthermore, coefficients are stored in a second recirculating memory and are used to calculate the output data points. As a result, only one memory access is required per output data point.

10 Claims, 4 Drawing Sheets

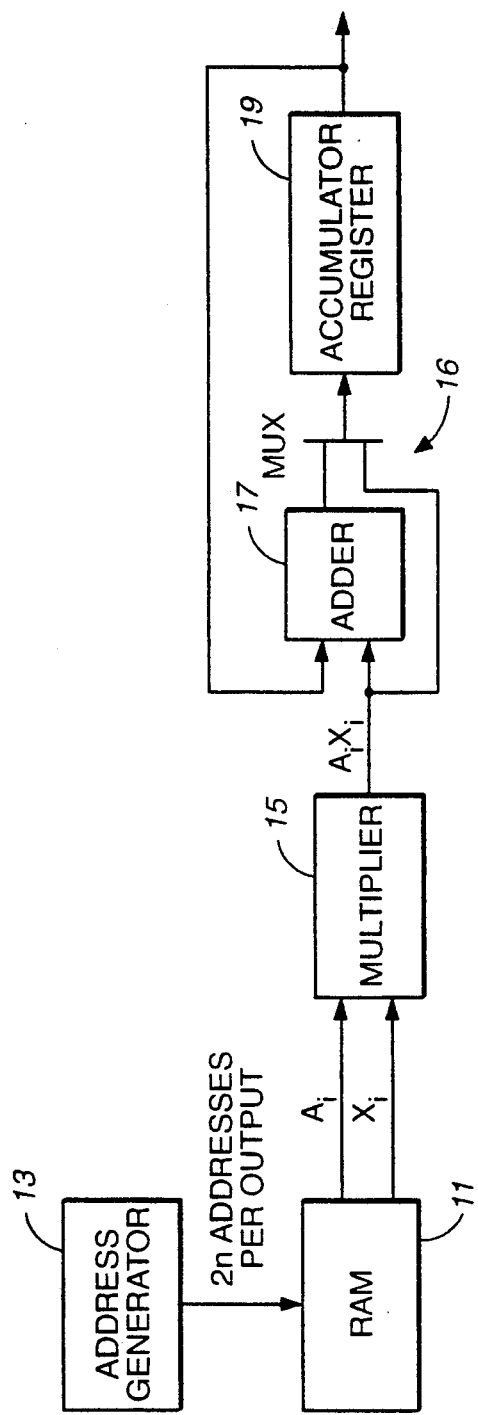
FIG._1
(PRIOR ART)

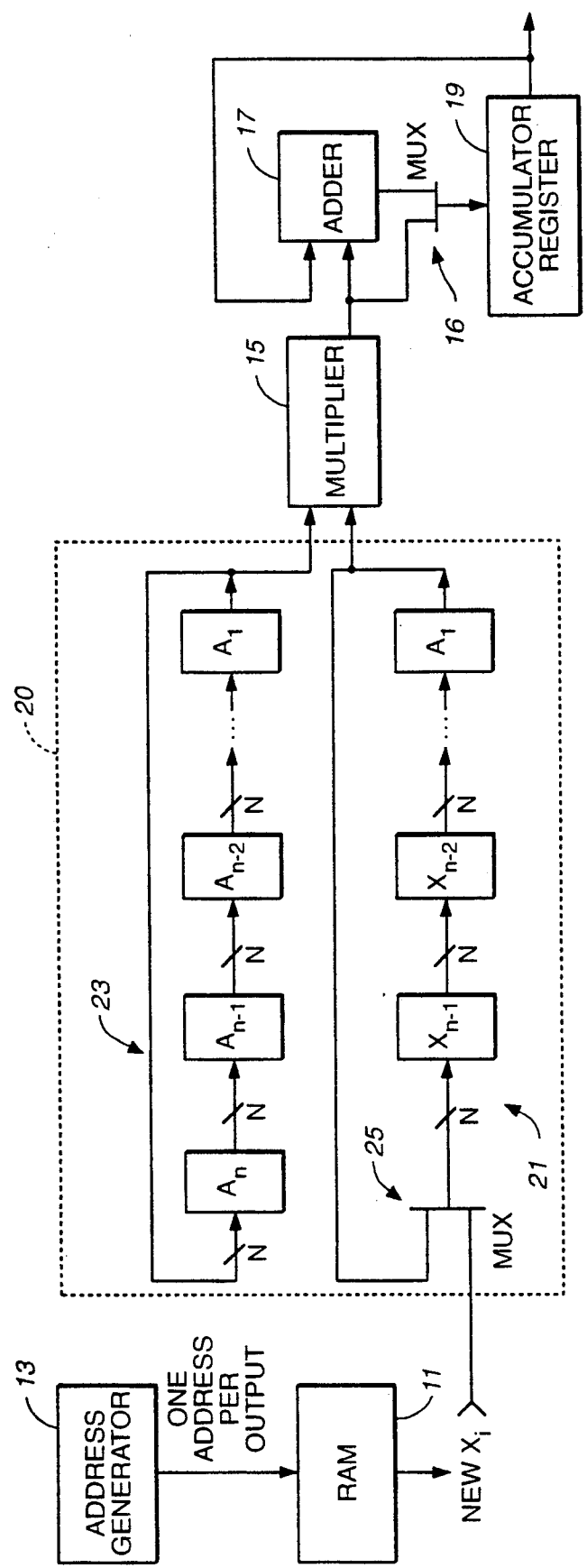
FIG._2

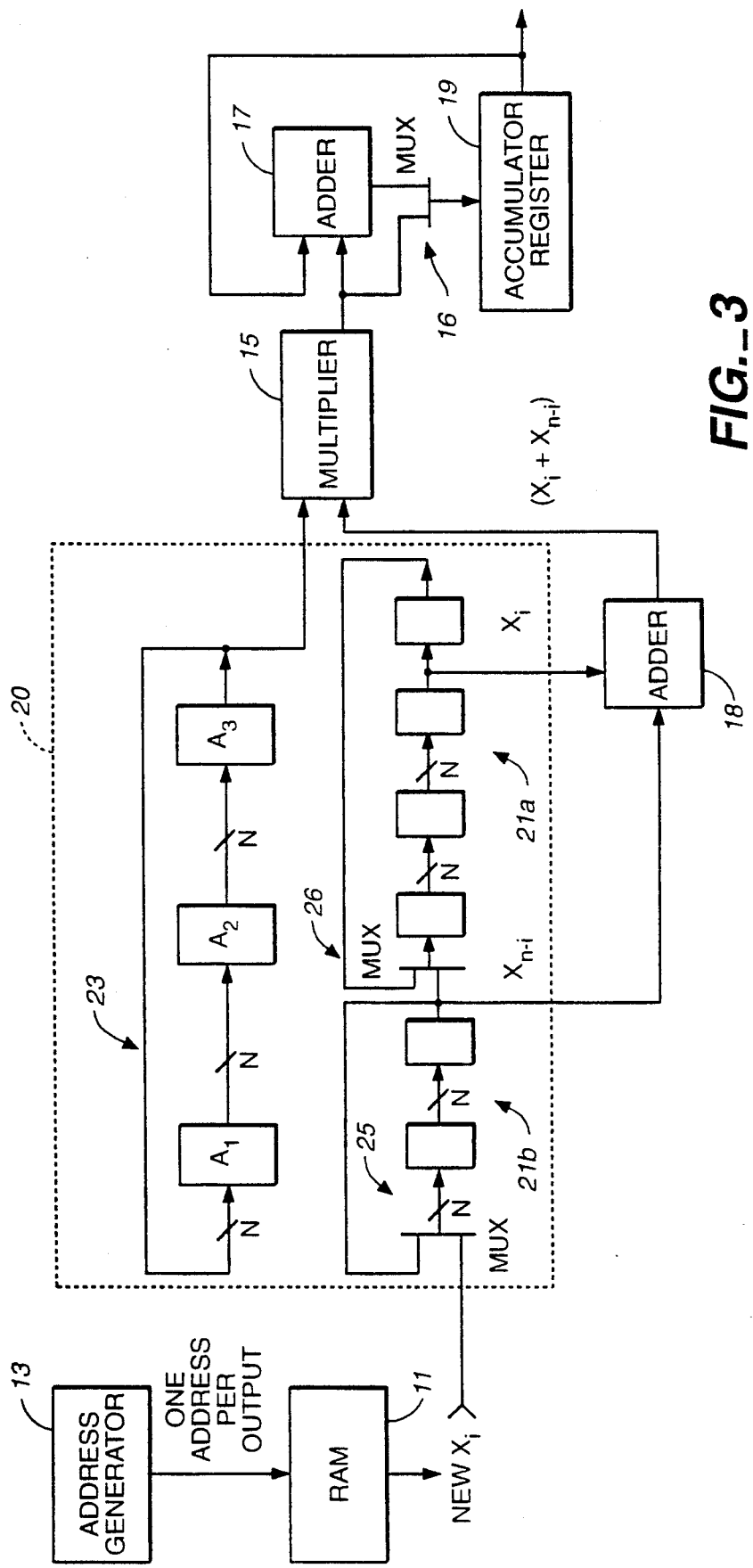
FIG._3

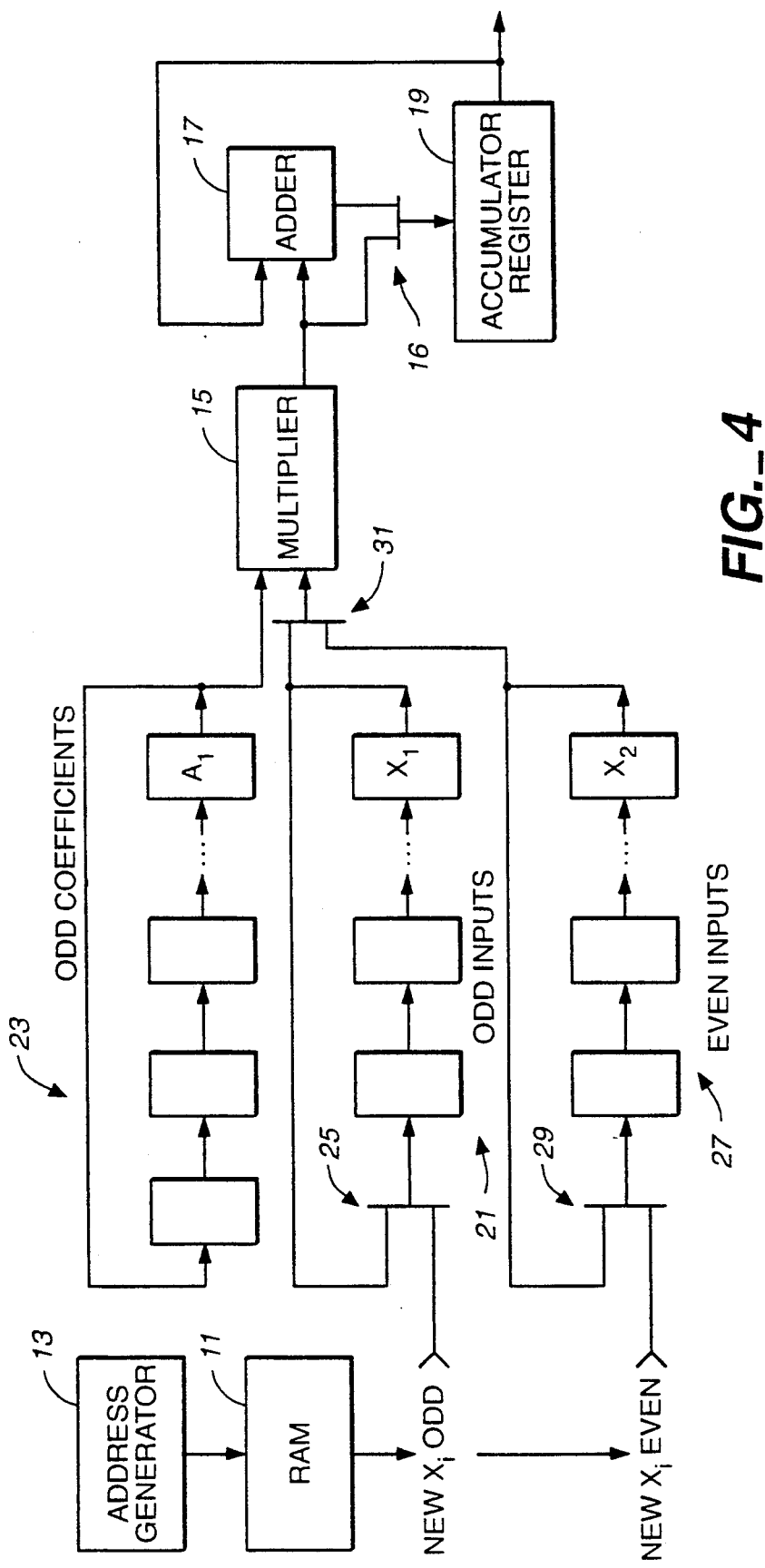
FIG._4

FINITE IMPULSE RESPONSE FILTER

BACKGROUND OF THE INVENTION

1. Field of the Invention

The present invention generally relates to digital filters and, more particularly, to a Finite Impulse Response (FIR) filter.

2. State of the Art

In conventional practice, computations involved in realizing a FIR filter have been memory access intensive. One data output point of a FIR filter is calculated as $$Y_1 = \sum_{i=1}^{N} A_i X_i = A_1 X_1 + \ldots + A_N X_N$$

and a succeeding output data point is calculated as $$Y_2 = \sum_{i=1}^{N} A_i X_{i+1} = A_1 X_2 + \ldots + A_N X_{N+1}$$

where $A_i$ is one of a series of coefficients defining a windowing function of the filter and $X_i$ is one of a series of input data points.

FIG. 1 shows a known system for performing the foregoing computations. In the system, the coefficients $A_i$ and the input data points $X_i$ are stored in a random access memory 11. The RAM 11 is addressed by an address generator 13 to output corresponding $A_i$ and $X_i$ to a multiplier 15 to form the product $A_i X_i$. The product $A_i X_i$ is input to either an adder 17 or, in the case $i=1$, to an accumulator register 19 through a multiplexer 16. When $i \neq 1$, the previous sum $$\sum_{j=1}^{i} A_j X_j$$

stored in the accumulator register 19 is added to the current product $A_i X_i$ in the adder 17 and the cumulative result is stored in the accumulator register 19 through the multiplexer 16. After the sum of the N products has been accumulated in the accumulator register 19, the contents of the accumulator register 19 is output as an output data point. In practice, the coefficients $A_i$ may either be fixed in the case of a non-adaptive filter or may be varied between the calculation of output data points in the case of an adaptive filter.

The system of FIG. 1 requires the address generator 13 to generate 2N addresses per output data point despite the fact that of the 2N operands involved in the calculation, only one of the operands, a new input data point, may differ from the operands involved in the previous calculation. For sophisticated filtering applications, the RAM 11 and its associated address generator 13 normally are so large (in terms of chip area) that they must be located on chips separate from the remainder of the FIR filter circuitry. In such cases, access time for the RAM 11 can be prolonged because of the need to drive the longer interconnect lines. For real-time applications, overcoming these delays requires the use of fast, expensive, and power-hungry logic.

SUMMARY OF THE INVENTION

According to the present invention, output data points of a digital filter are calculated by storing input data points in an addressable memory and accessing the addressable memory to supply a new input data point exactly once for each output data point after a first output data point and storing each input data point in a first recirculating memory for so long as that input data point is needed to calculate a next output data point. The input data points stored in the first recirculating memory are used to calculate output data points. Furthermore, coefficients are stored in a second recirculating memory and used to calculate the output data points. As a result, only one memory access is required per output data point.

BRIEF DESCRIPTION OF THE DRAWINGS

The present invention can be further understood with reference to the following description in conjunction with the appended drawings, wherein like elements are provided with the same reference numerals. In the drawings:

FIG. 1 is a block diagram of a circuit, according to the prior art, for realizing a FIR filter;

FIG. 2 is a block diagram of a circuit for realizing a FIR filter according to the present invention;

FIG. 3 is a block diagram of a modification of the circuit of FIG. 2 for realizing a symmetric FIR filter; and FIG. 4 is a block diagram of a modification of the circuit of FIG. 2 for realizing an odd FIR filter.

DETAILED DESCRIPTION OF THE PREFERRED EMBODIMENTS

FIG. 2 shows a circuit for realizing a FIR filter which is similar to the circuit of FIG. 1 except that it additionally includes a buffer memory 20 between the RAM 11 and the multiplier 15. For simplicity and convenience of description, the drawing does not show the control circuitry for producing a common clock signal, select signals for the multiplexers 16 and 25 and memory control signals for the address generator 13 and the RAM 11.

As shown in FIG. 2, the buffer memory 20 includes a recirculating shift register 21 for buffering input data points $X_i$ and a recirculating shift register 23 for buffering coefficients $A_i$. Both of the recirculating shift registers are N bits wide. Although the coefficients $A_i$ can be variable, FIG. 2 depicts those coefficients as being fixed. A particularly advantageous realization of the recirculating shift register 23 is disclosed in U.S. patent application Ser. No. 07/839,192 for Sequentially Accessible Non-Volatile Circuit for Storing Data filed on Feb. 20, 1992. The function of the recirculating shift register 23 is to output the coefficients $A_i$ in turn, beginning with a first coefficient $A_i$ and ending with a last coefficient $A_a$; then the shift register starts over with a first coefficient $A_1$, and so forth.

The function of the recirculating shift register 21 is analogous except that the input data points $X_i$ circulate with replacement such that subsequent to calculation of a first output data point, $X_2$ then becomes the first input data point and $X_{a+1}$ becomes the last input data point. Replacement is accomplished using a multiplexer 25 selecting between inputs from the output of the recirculating shift register 21 and from the RAM 11. For each complete cycle of the recirculating shift register 23 holding the coefficients $A_i$, a new $X_i$ is input to the recirculating shift register 21 holding the input data points through the multiplexer 25 from the RAM 11. The recirculating shift register 21 has one less stage than the recirculating shift register 23 in order to "shift" the series of input data points $X_i$ with respect to the series of coefficients $A_i$ as will be more fully understood with reference to the following example and Table I below.

In Table I, a first line represents the coefficients $A_i$ stored in the recirculating shift register 23 and the second line represents the input data points $X_i$ stored in the recirculating shift register 21. The right hand column represents the product of the corresponding coefficient and input data point right-most on the first and second lines. The left hand column represents the occurrence of a circular shift with the possible insertion of a new input data point $X_i$ indicated in parentheses. For simplicity of discussion in the following, it will be assumed that the recirculating shift register 23 holding the coefficients is four stages long and that the recirculating shift register 21 holding the input data points is three stages long.

TABLE I

|  | $A_4$ | $A_3$ | $A_2$ | $A_1$ | $A_1X_1$ |
|---|---|---|---|---|---|
|  |  | $X_3$ | $X_2$ | $X_1$ |  |
| SHIFT (NEW $X_i$) |  |  |  |  |  |
|  | $A_1$ | $A_4$ | $A_3$ | $A_2$ | $A_2X_2$ |
|  |  | $X_4$ | $X_3$ | $X_2$ |  |
| SHIFT |  |  |  |  |  |
|  | $A_2$ | $A_1$ | $A_4$ | $A_3$ | $A_3X_3$ |
|  |  | $X_2$ | $X_4$ | $X_3$ |  |
| SHIFT |  |  |  |  |  |
|  | $A_3$ | $A_2$ | $A_1$ | $A_4$ | $A_4X_4$ |
|  |  | $X_3$ | $X_2$ | $X_4$ |  |
| SHIFT |  |  |  |  |  |
|  | $A_4$ | $A_3$ | $A_2$ | $A_1$ | $A_1X_2$ |
|  |  | $X_4$ | $X_3$ | $X_2$ |  |
| SHIFT (NEW $X_i$) |  |  |  |  |  |
|  | $A_1$ | $A_4$ | $A_3$ | $A_2$ | $A_2X_3$ |
|  |  | $X_5$ | $X_4$ | $X_3$ |  |

At the outset, the recirculating shift registers 23 and 21 are assumed to contain coefficients and input data points as shown at the top of Table I. $A_1$ and $X_1$ are input to the multiplier forming the product $A_1X_1$. The calculation of the first output data point has just begun, but already it is known that the first input data point $X_1$ will not be needed for calculation of the second output data point. Instead, the first input data point $X_1$ will be discarded and each of the succeeding input data points will be "promoted" one position. Therefore, a shift is performed wherein the multiplexer 25, instead of recirculating a first input data point $X_1$, accepts instead a new input data point $X_4$ output from the RAM 11 in cooperation with the address generator 13. The products $A_2X_2$, $A_3X_3$ and $A_4X_4$ are thereafter formed in succession with intervening shifts. Accumulation of the first output data point is then complete. After a next shift, $X_2$ becomes the output of the recirculating shift register 21, $X_1$ having been previously discarded, and the product $A_1X_2$ is formed, beginning accumulation of the second output data point. Upon occurrence of the next shift, $X_2$ is discarded since it will not be needed in calculation of the third output data point. Operation continues in this fashion.

By using the buffer memory 20 to store coefficients and input data points from the calculation of one output data point that will be required for the calculation of a next output data point, only one "external" memory access is required per output. As a result, a slower less expensive RAM may be used or, still using fast RAM, the clock speed of each of the circuits may be increased so as to generate outputs at a much faster rate.

The circuit of FIG. 2 can be modified to realize special cases of the general FIR filter in a computationally efficient manner. For example, in a symmetric FIR filter, the first and last coefficients $A_1$ and $A_a$ are equal as are the second and next to last coefficients $A_2$ and $A_{a-1}$, and so forth. To realize a symmetric FIR filter in a computationally efficient manner, only one of each pair of equal coefficients is stored and the input data points corresponding to the pair of equal coefficients are added and multiplied by the single stored coefficient since $A_1X_1 + A_aX_a \times A_1(X_1 + X_a)$ for $A_1 \times A_a$. The corresponding circuit is shown in FIG. 3, configured for a six-point symmetric FIR filter as an exemplary case.

Referring to FIG. 3, assuming a six-point symmetric FIR filter, the recirculating shift register 23 for buffering coefficients $A_i$ is only three stages long and stores only one of each pair of equal coefficients, for example $A_1$, $A_2$ and $A_3$ of the pairs $(A_1, A_6)$, $(A_2, A_5)$ and $(A_3, A_4)$ where $A_1 \times A_6$, $A_2 \times A_5$ and $A_3 \times A_4$. The recirculating shift register 21 for buffering input data points $X_i$ is split into two separate recirculating shift registers 21a and 21b for buffering the first half and the last half, respectively, of the data points.

The recirculating shift register 21a for buffering the first half of the data points has a number of stages one greater than half the number of data points and produces an output $X_i$ at the output of the next-to-last stage. For a six-point symmetric FIR filter, the recirculating shift register 21a has $(6+2)+1 = 4$ stages. A multiplexer 26 selects between the output of the recirculating shift register 21b and the output of the recirculating shift register 21a itself to provide an input to the first stage of the recirculating shift register 21a. The recirculating shift register 21b has a number of stages one less than half the number of data points $(6/2-1=2)$ and produces at its last stage an output $X_{a-1}$. The outputs $X_i$ and $X_{a-i}$ of the recirculating shift registers 21a and 21b are added together in an adder 18 and the sum is input to the multiplier 15 for multiplication by the appropriate coefficient $A_i$.

Operation of the circuit of FIG. 3 may be better understood with reference to Table II below. Table II is of similar format as Table I referenced previously but concerns only the formation of the sum $X_i + X_{a-i}$ rather than the product $A_iX_i$. The first line therefore represents the input data points stored in the recirculating shift register 21a and the second line represents the input data points stored in the recirculating shift register 21b. Since the output of the recirculating shift register 21a is taken from the next-to-last stage, the contents of the last stage, represented by the right-most entry on the first line, is indicated in parentheses.

TABLE II

|  | $X_1$ | $X_2$ | $X_3$ | ( ) | $X_3 + X_4$ |
|---|---|---|---|---|---|
|  |  | $X_5$ | $X_4$ |  |  |
| SHIFT (NEW X) |  |  |  |  |  |
|  | $X_4$ | $X_1$ | $X_2$ | $(X_3)$ | $X_2 + X_5$ |
|  |  | $X_6$ | $X_5$ |  |  |
| SHIFT |  |  |  |  |  |
|  | $X_3$ | $X_4$ | $X_1$ | $(X_2)$ | $X_1 + X_6$ |
|  |  | $X_5$ | $X_6$ |  |  |
| SHIFT |  |  |  |  |  |
|  | $X_2$ | $X_3$ | $X_4$ | $(X_1)$ | $X_4 + X_5$ |
|  |  | $X_6$ | $X_5$ |  |  |
| SHIFT (NEW X) |  |  |  |  |  |
|  | $X_5$ | $X_2$ | $X_3$ | $(X_4)$ | $X_3 + X_6$ |
|  |  | $X_7$ | $X_6$ |  |  |
| SHIFT |  |  |  |  |  |
|  | $X_4$ | $X_5$ | $X_2$ | $(X_3)$ | $X_2 + X_7$ |
|  |  | $X_6$ | $X_7$ |  |  |

At the outset, the recirculating shift registers 21a and 21b are assumed to contain input data points as shown at the top of Table II. To load the recirculating shift register 21a as indicated, the first half of the input data points are input to recirculating shift register 21b in reverse order and shifted through to recirculating shift register 21a, after which the last half of the input data points are input to recirculating shift register 21b in regular order. The first half of the coefficients, $A_1$, $A_2$ and $A_3$, are input to the recirculating shift register 23 in reverse order $A_3$, $A_2$, $A_1$. The sum of the middle or innermost two input data points $X_3$ and $X_4$ of the sequence $X_1$, $X_2$, $X_3$, $X_4$, $X_5$, $X_6$ is first formed, after which a shift is performed in which the contents of the right-most stage of the recirculating shift register 21a are discarded, contents of the right-most stage of recirculating shift register 21b are input to the left-most stage of recirculating shift register 21a, and a new input data point is input to the left-most stage of recirculating shift register 21b. The sum of the next-to-innermost input data points, $X_2$ and $X_5$, is then formed, followed by a recirculating shift by each of the recirculating shift register 21a and 21b and summing of the outermost input data points in the sequence, $X_1$ and $X_6$. The first output data point is therefore formed as $A_3(X_3+X_4)+A_2(X_2+X_5)+A_1(X_1+X_6)$. Operation continues in this fashion.

The circuit of FIG. 2 may also be modified as shown in FIG. 4 in the case of an odd FIR filter. In an odd FIR filter, even-indexed coefficients $A_2$, $A_4$, $A_6$... are uniformly zero. Therefore, imagining the series of coefficients being "shifted across" the longer series of input data points after the calculation of each output data point, the zero even-indexed coefficients will first be aligned with even-indexed input data points, then with odd-indexed input data points, then again with even-indexed input data points, and so forth such that half the $X_i$'s are not used to calculate each output. The $X_i$'s can therefore be split into two recirculating shift registers, one holding even-indexed $X_i$ and the other holding odd-indexed $X_i$. The shift registers are then used alternately for every other output calculation.

In FIG. 4, recirculating shift register 23 now holds only odd-indexed coefficients, the even-indexed coefficients being zero, recirculating shift register 21 holds odd-indexed input data points, and an additional recirculating shift register 27 holds even-indexed input data points. Recirculating shift register 27 includes a multiplexer 29 to effect replacement in like manner as multiplexer 25 of recirculating shift register 21. A multiplexer 31 selects between the outputs of the recirculating shift register 21 and the recirculating shift register 27 for input to the multiplier 15.

The foregoing has described the principles, preferred embodiments and modes of operation of the present invention. However, the invention should not be construed as limited to the particular embodiments discussed. Instead, the above-described embodiments should be regarded a illustrative rather than restrictive, and it should be appreciated that variations ma be made in those embodiments by workers skilled in the art without departing from the scope of present invention as defined by the following claims.

What is claimed is:

1. A method of calculating output data points of a Finite Impulse Response filter comprising the steps of:
   storing, in order, a plural number of coefficients in a first recirculating shift register means;
   storing, in order, input data points one fewer than said number in a second recirculating shift register means; and
   multiplying respective ones of the coefficients and input data points and accumulating the results of the multiplication as the coefficients and the input data points are circulated in the respective recirculating shift register means.

2. The method of claim 1 further comprising the step of inserting a new data point in the second recirculating shift register means once every complete cycle of the first recirculating shift register means.

3. A system for calculating output data points of a Finite Impulse Response filter comprising:
   first recirculating shift register means for storing in order a plural number of coefficients;
   second recirculating shift register means for storing in order input data points one fewer than said number; and
   means for multiplying respective ones of the coefficients and input data points and for accumulating the results of the multiplying a the coefficients and the input data points are circulated in the first and second recirculating shift register means.

4. The system of claim 3 further comprising means for inserting a new data point in the second recirculating shift register once every complete cycle of the first recirculating shift register.

5. The system of claim 4 wherein the means for multiplying and accumulating comprises a multiplier having input terminals connected to output terminals of the recirculating shift registers, an adder, and an accumulator register, input terminals of the adder being connected to output terminals of the multiplier and the accumulator register and an input terminal of the accumulator register being connected to an output terminal of the adder.

6. The system of claim 5 wherein the means for inserting comprises an address generator, an addressable memory, and a first multiplexer, the address generator supplying an address to the memory and the memory supplying an input data point to the first multiplexer, the first multiplexer being connected also to the output terminal of the second recirculating shift register to select between an input data point output at the output terminal of the second recirculating shift register and an input data point from the memory, an output terminal of the first multiplexer being connected to a first stage of the second recirculating shift register.

7. The system of claim 6 wherein the input terminal of the accumulator register is connected to the output terminal of the adder through a second multiplexer, the input terminal of the accumulator register being connected to the output terminal of the multiplier through the second multiplexer.

8. A method of calculating output data points of a digital filter comprising the steps of:
   storing a plurality of coefficients in a first recirculating store;
   storing every other one of a series of input data points in a second recirculating store;
   storing ones of the series of input data points not stored in the second recirculating store in a third recirculating store;
   multiplying respective ones of the coefficients and input data points stored in the second recirculating store and accumulating the results of the multiplication as the coefficients and the input data points are circulated to produce an output data point; and multiplying respective ones of the coefficients and input data points stored in the third recirculating store and accumulating the results of the multiplication as the coefficients and the input data points are circulated to produce an output data point.

9. A method of calculating output data points of a digital filter, comprising the steps of:
   (a) storing input data points in an addressable memory;
   (b) accessing the addressable memory to supply a plurality of input data points;
   (c) storing said plurality of input data points in a first recirculating shift register;
   (d) using said plurality of input data points to calculate a first output data point;
   (e) accessing the addressable memory to supply a new input data point;
   (f) discarding one of said input data points from said first recirculating shift register and storing said new point data point in said first recirculating shift register;
   (g) outputting said first output data point;
   (h) using input data points stored in said first recirculating shift register to calculate a next output data point;
   (i) accessing the addressable memory to supply to new input data point;
   (j) discarding one of said input data points from said first recirculating shift register and storing said new input data point in said first recirculating shift register;
   (k) outputting a next output data point; and
   (l) repeating steps (h), (i), (j) and (k).

10. The method of claim 9 further comprising the step of storing coefficients in a second recirculating shift register and wherein the using steps comprise using also the coefficients stored in the second recirculating shift register to calculate the output data points.

* * * * *